United States Patent
Collier et al.

(10) Patent No.: US 9,472,788 B2
(45) Date of Patent: Oct. 18, 2016

(54) THERMALLY-ASSISTED SELF-ASSEMBLY METHOD OF NANOPARTICLES AND NANOWIRES WITHIN ENGINEERED PERIODIC STRUCTURES

(71) Applicant: 3M INNOVATIVE PROPERTIES COMPANY, St. Paul, MN (US)

(72) Inventors: Terry O. Collier, Woodbury, MN (US); Michael Benton Free, St. Paul, MN (US); Evan L. Schwartz, Vadnais Heights, MN (US); Martin B. Wolk, Woodbury, MN (US); Justin P. Meyer, Cedar, MN (US)

(73) Assignee: 3M Innovative Properties Company, St. Paul, MN (US)

( * ) Notice: Subject to any disclaimer, the term of this patent is extended or adjusted under 35 U.S.C. 154(b) by 68 days.

(21) Appl. No.: 14/470,324

(22) Filed: Aug. 27, 2014

(65) Prior Publication Data
US 2016/0064696 A1  Mar. 3, 2016

(51) Int. Cl.
*H01L 21/477* (2006.01)
*H01L 51/56* (2006.01)
(Continued)

(52) U.S. Cl.
CPC .............. *H01L 51/56* (2013.01); *B32B 3/263* (2013.01); *B32B 3/28* (2013.01); *B32B 27/08* (2013.01); *B44C 1/00* (2013.01); *C03C 17/007* (2013.01); *C03C 17/42* (2013.01); *H01L 21/477* (2013.01); *H01L 51/00* (2013.01); *H01L 51/5268* (2013.01); *H01L 51/5271* (2013.01); *H01L 51/5275* (2013.01); *B32B 2255/10* (2013.01); *B32B 2255/20* (2013.01); *B32B 2307/516* (2013.01); *B32B 2457/20* (2013.01);
(Continued)

(58) Field of Classification Search
CPC .................................................. H01L 21/7806
See application file for complete search history.

(56) References Cited

U.S. PATENT DOCUMENTS

| RE24,906 E | 12/1960 | Ulrich |
|---|---|---|
| 5,693,446 A | 12/1997 | Staral |

(Continued)

FOREIGN PATENT DOCUMENTS

| EP | 1 871 620 | 8/2011 |
|---|---|---|
| JP | 2007-335253 | 12/2007 |

(Continued)

OTHER PUBLICATIONS

Bang, "Assembly and Densification of Nanowire Arrays via Shrinkage," ACS Nano Letters, 2014, vol. 14, No. 6, pp. 3304-3308.

(Continued)

*Primary Examiner* — Stephen W Smoot
(74) *Attorney, Agent, or Firm* — Jeffrey S. Kollodge (57) ABSTRACT

Methods for transferring nanoparticles and nanowires to permanent glass receptors using transfer films. The transfer films include nanoparticles within a sacrificial material having a structured backfill layer on a substrate and a nanowire formulation between sacrificial substrates. To transfer the nanoparticles, the transfer film is laminated to a glass receptor, the substrate is removed, and the sacrificial material is baked-out to leave the nanoparticles aligned within the structured surface of the backfill layer on the glass receptor. To transfer the nanowires, the transfer film is laminated to a glass receptor, and the sacrificial substrates are baked-out to leave the nanowires aligned on the glass receptor.

23 Claims, 7 Drawing Sheets (51) Int. Cl.
B44C 1/00 (2006.01)
C03C 17/00 (2006.01)
C03C 17/42 (2006.01)
H01L 51/00 (2006.01)
B32B 3/26 (2006.01)
H01L 51/52 (2006.01)
B32B 27/08 (2006.01)
B32B 3/28 (2006.01)

(52) U.S. Cl.
CPC ..... C03C2217/40 (2013.01); H01L 2251/301 (2013.01); H01L 2251/5369 (2013.01); Y10S 977/90 (2013.01)

(56) References Cited

U.S. PATENT DOCUMENTS

| | | | |
|---|---|---|---|
| 6,015,719 | A | 1/2000 | Kish, Jr. |
| 6,329,058 | B1 | 12/2001 | Arney |
| 6,485,884 | B2 | 11/2002 | Wolk |
| 6,521,324 | B1 | 2/2003 | Debe |
| 6,849,558 | B2 | 2/2005 | Schaper |
| 6,858,253 | B2 | 2/2005 | Williams |
| 7,384,809 | B2 | 6/2008 | Donofrio |
| 7,589,461 | B2 | 9/2009 | Park |
| 7,758,919 | B2 | 7/2010 | Ozin |
| 7,842,153 | B2 * | 11/2010 | Chien ............ H01M 4/8814 156/230 |
| 7,957,621 | B2 | 6/2011 | Zhang |
| 8,241,732 | B2 | 8/2012 | Hansen |
| 8,377,540 | B2 | 2/2013 | Chiu |
| 8,586,131 | B2 | 11/2013 | Lieber |
| 8,692,446 | B2 | 4/2014 | Zhang |
| 8,999,820 | B2 * | 4/2015 | Byun ............. H01L 51/0003 438/478 |
| 2004/0194505 | A1 | 10/2004 | Wang |
| 2006/0270806 | A1 | 11/2006 | Hale |
| 2007/0042174 | A1 | 2/2007 | Rao |
| 2008/0137367 | A1 | 6/2008 | Kim |
| 2009/0015142 | A1 | 1/2009 | Potts |
| 2009/0322219 | A1 | 12/2009 | Wolk |
| 2010/0006211 | A1 | 1/2010 | Wolk |
| 2010/0133511 | A1* | 6/2010 | Zhou ............. B82Y 10/00 257/24 |
| 2010/0160577 | A1 | 6/2010 | Hirano |
| 2011/0182805 | A1 | 7/2011 | DeSimone |
| 2011/0305787 | A1 | 12/2011 | Ishii |
| 2012/0099323 | A1 | 4/2012 | Thompson |
| 2012/0234460 | A1 | 9/2012 | Zhang |
| 2013/0011608 | A1 | 1/2013 | Wolk |
| 2013/0051032 | A1 | 2/2013 | Jones |
| 2014/0021492 | A1 | 1/2014 | Wolk |
| 2014/0175707 | A1 | 6/2014 | Wolk |
| 2014/0178646 | A1 | 6/2014 | Wolk |
| 2014/0242343 | A1 | 8/2014 | Free |
| 2015/0202834 | A1 | 7/2015 | Free |
| 2015/0207107 | A1 | 7/2015 | Schwartz |

FOREIGN PATENT DOCUMENTS

| | | |
|---|---|---|
| WO | WO 2012-082536 | 6/2012 |
| WO | WO 2012/125321 | 9/2012 |
| WO | WO 2014/014595 | 1/2014 |
| WO | WO 2014/099388 | 6/2014 |
| WO | WO 2014/133799 | 9/2014 |
| WO | WO 2015/108773 | 7/2015 |
| WO | WO 2015/108953 | 7/2015 |
| WO | WO 2015/112711 | 7/2015 |

OTHER PUBLICATIONS

Cui, "Integration of Colloidal Nanocrystals Into Lithographically Patterned Devices," Nano Letters, 2004, vol. 4, No. 6, pp. 1093-1098.

Do, "Enhanced light extraction efficiency from organic light emitting diodes by insertion of a two-dimensional photonic crystal structure," Journal of Applied Physics, Dec. 15, 2004, vol. 96, No. 12, pp. 7629-7636.

Fujita, "Optical and Electrical Characteristics of Organic Light-Emitting Diodes with Two-Dimensional Photonic Crystals in Organic/Electrode Layers," Japanese Journal of Applied Physics, 2005, vol. 44, No. 6A, pp. 3669-3677.

Hong, "Review Paper: Recent Developments in Light Extraction Technologies of Organic Light Emitting Diodes," Electronic Materials Letters, 2011, vol. 7, No. 2, pp. 77-91.

Kim, "Planarized Si N x /spin-on-glass photonic crystal organic light-emitting diodes," Applied Physics Letters, 2006, vol. 89, No. 17, pp. 173502-1-173502-3.

Lee, "Far-field radiation of photonic crystal organic light-emitting diode," Optics Express, Jul. 19, 2005, vol. 13, No. 15, pp. 5864-5870.

Lee, "Fabrication of large area flexible and highly transparent film by a simple Ag nanowire alignment," Journal of Experimental Nanoscience, 2013, vol. 8, No. 2, pp. 130-137.

Ma, "Preparation and optical polarization of Ag/epoxy composite films with aligned Ag nanowires," Journal of Alloys and Compounds, Apr. 15, 2014, vol. 592, pp. 57-62.

Matterson, "Increased Efficiency and Controlled Light Output from a Microstructured Light-Emitting Diode," Advanced Materials, Jan. 16, 2001, vol. 13, No. 2, pp. 123-127.

Neyts, "Microcavity effects and the outcoupling of light in displays and lighting applications based on thin emitting films," Applied Surface Science, 2005, vol. 244, pp. 517-523.

Ozin, "The Race for the Photonic Chip: Colloidal Crystal Assembly in Silicon Wafers," Advanced Functional Materials, Apr. 2001. vol. 11, No. 2, pp. 95-104.

Peng, "Enhanced coupling of light from organic light emitting diodes using nanoporous films," Journal of Applied Physics, Aug. 1, 2004, vol. 96, No. 3, pp. 1649-1654.

Richmond, "Pressureless nanoimprinting of anatase $TiO_2$ precursor films," J. Vac. Sci. Technol., Mar./Apr. 2011, vol. B29, No. 2, pp. 021603-1-021603-5.

Ro, "High-Modulus Spin-On Organosilicate Glasses for Nanoporous Applications," Advanced Materials, Mar. 2007, vol. 19, No. 5, pp. 705- 710.

Saxena, "A review on the light extraction techniques in organic electroluminescent devices," Optical Materials, 2009, vol. 32, No. 1, pp. 221-233.

Schnitzer, "30% external quantum efficiency from surface textured, thinfilm light emitting diodes," Appl. Phys. Lett., Oct. 18, 1993, vol. 63, No. 16, pp. 2174-2176.

Schnitzer, "Ultrahigh spontaneous emission quantum efficiency, 99.7% internally and 72% externally, from AlGaAs/GaAs/AlGaAs double heterostructures," Appl. Phys. Lett., Jan. 11, 1993, vol. 62, No. 2, pp. 131-133.

Shaw, "Negative photoresists for optical lithography," IBM Journal of Research and Development, Jan./Mar. 1997, vol. 41, No. 1/2, pp. 81-94.

Wu, "Soluble Polymer-Based, Blown Bubble Assembly of Single- and Double-Layer Nanowires with Shape Control," ACS Nano, 2014, vol. 8, No. 4, pp. 3522-3530.

Xia, "Lithographically directed deposition of silica nanoparticles using spin coating," Journal of Vacuum Science & Technology, Nov./Dec. 2004, vol. B 22, No. 6, pp. 3415-3420.

Yamasaki, "Organic light-emitting device with an ordered monolayer of silica microspheres as a scattering medium," Appl. Phys. Lett., Mar. 6, 2000, vol. 76, No. 10, pp. 1243-1245.

Yu, "Large-area blown bubble films of aligned nanowires and carbon nanotubes," Nature Nanotechnology, Jun. 2007, vol. 2, pp. 372-377.

U.S. Appl. No. 14/968,362, filed Dec. 14, 2015, Wolk.
U.S. Appl. No. 14/969,625, filed Dec. 15, 2015, Wolk.
International Search Report—PCT/US2015/046961, dated Feb. 22, 2016.

* cited by examiner

THERMALLY-ASSISTED SELF-ASSEMBLY METHOD OF NANOPARTICLES AND NANOWIRES WITHIN ENGINEERED PERIODIC STRUCTURES

BACKGROUND

Nanostructures and microstructures, possibly including nanoparticles, on glass substrates are used for a variety of applications in display, lighting, architecture and photovoltaic devices. In display devices the structures can be used for enhanced light extraction or distribution. In lighting devices, the structures can be used for enhanced light extraction, distribution, and decorative effects. In photovoltaic devices, the structures can be used for solar concentration and anti-reflection. Patterning or otherwise forming nanostructures and microstructures on large glass substrates, particularly with nanoparticles, can be difficult and not cost-effective, motivating the present invention.

The majority of the light generated in the emissive layer of OLEDs is trapped by total internal reflection and waveguiding effects in the OLED layers and glass substrate. Light entrapment can lead to up to ~80% reduction in efficiency of OLED displays. The loss of efficiency, in turn, translates to lower luminance, increased power consumption and shorter display lifetime and battery life.

A number of approaches have been demonstrated to improve the light extraction efficiency. These are typically based on either diffractive or optical scattering mechanisms, and include two-dimensional or 3D photonic crystal (PC) structures, roughened interfaces or textured surfaces, reflecting surfaces and distributed Bragg reflectors, nanoporous films, or the use of resonant Microcavity structures.

U.S. Pat. No. 8,692,446 describes a novel light out-coupling construction that when incorporated in an organic light-emitting device (OLED), provides enhanced light extraction as well as improved angular and spectral uniformity. The out-coupling construction can be used as a substrate for OLED fabrication, and contains light extraction features consisting of coatings of nanoparticles (0.1~0.8 µm in diameter) applied to a polymeric substrate pre-patterned with one-dimensional or two-dimensional periodic structures. This patent also demonstrates that the nanoparticle/grating structure can be planarized with a high-index coating such as silicon introduce to match the refractive index of the transparent conductor used in the OLED, typically Indium Tin Oxide.

These approaches can provide following advantages over pure one-dimensional gratings and two-dimensional grating structures as well as a coating of the nanoparticles alone. For example: The presence of the 1D or 2D periodic structures can improve the uniformity of the nanoparticle coatings; and compared to purely periodic extraction features, the combination of nanoparticles with the 1D or 2D periodic structures can improve the angular and spectral uniformity.

However, the polymer used for the 1D grating may not be dimensionally stable during the process of creating the OLEO display stack, in which high temperatures are used to anneal the indium tin oxide transparent conductor. There is also a number of coating steps that are needed in order to manufacture this structure which will raise the cost of manufacturing the product.

In U.S. Patent Application Publication No. 2014/0021,492, nanostructured lamination transfer films are described that enable the fabrication of nanostructured solid stutters, using simple lamination and bake out steps. The invention detailed the use of a microreplicated polymer film, whose micro-cavities can be filled with an inorganic polysiloxane coating. After curing the polysiloxane to a green state, the stack can be transferred to a glass slide with the microreplicated polymer film facing up. The entire construction is then baked in an oven to remove the polymer film and completely condense the inorganic polysiloxane. The resulting inorganic coating imparts microstructure to the glass slide, in the form of the inverse "daughter" of the microstructure imparted in the polymer film.

We propose an improved method to create self-aligned silica nanoparticles within a one-dimensional silica grating to produce optically functional inorganic coatings. To create the structure, a roll-to-roll coated precursor film could be applied to a substrate via lamination and bake steps. During the bake step, the nearly monodisperse nanoparticles settle into the microreplicated structure formed by the siloxane coating.

SUMMARY

A method for transferring nanoparticles to a permanent receptor substrate, consistent with the present invention, includes providing a transfer film comprising a substrate having monodisperse nanoparticles in a sacrificial resin. A structure is imparted on the sacrificial resin on a side opposite the substrate to produce a structured surface on the sacrificial resin. The pitch of the structure is matched to the diameter of the monodisperse nanoparticles. A backfill layer is applied to the transfer film, and the backfill layer has a first surface substantially conforming to the structured surface and a second surface opposite the first surface. The transfer film with the backfill layer is laminated to a permanent receptor with the second surface of the backfill layer applied to the receptor, and the substrate is removed. The sacrificial resin is baked out to produce a template layer of the nanoparticles on the first surface of the backfill layer.

A method for transferring nanowires to permanent receptor, consistent with the present invention, includes providing a transfer film comprising a first sacrificial substrate, a second sacrificial substrate, and a nanowire formulation between the first and second substrates. The transfer film is uniaxially stretched under a heat treatment and then laminated to a permanent receptor. The first and Second sacrificial substrates are baked out to produce aligned nanowires from the nanowire formulation on the permanent receptor.

BRIEF DESCRIPTION OF THE DRAWINGS

The accompanying drawings are incorporated in and constitute a part of this specification and, together with the description, explain the advantages and principles of the invention. In the drawings.

DETAILED DESCRIPTION

Lamination transfer films and methods are described that provide for the creation of a unique self-assembled nanostructure using a bake-out method. The method uses a sacrificial radiation-curable resin loaded with monodisperse nanoparticles. The resin can be microreplicated via conventional continuous cast and cure or embossing techniques to form a periodic structure. The pitch of the structure is matched to the diameter of the monodisperse nanoparticles. The diameter of the nanoparticles may be within 200% of the pitch dimension, 150% of the pitch dimension, 100% of the pitch dimension, 75% of the pitch dimension, 50% of the pitch dime.nsion, 25% of the pitch dimension, 10% of the pitch dimension. The structure is then backfilled with a thermally stable material, transferred to a receptor substrate, and then fired to bake out the sacrificial template. During the bake-out, the nanoparticles self-assemble into the grooves formed during the microreplication step to form structures that can be useful for enhanced light extraction, signaling via structural color, or other applications.

Lamination transfer films and methods are also described that provide a process for depositing and orienting high aspect ratio inorganic nanoparticles, nanocrystals, and nanotubes on glass, silicon, or other thermally stable receptors. The method involves coating a layer comprising, the nanomaterials onto a sacrificial thermoplastic film, stretching the film to orient the nanoparticles while heat treating the film, laminating the stretched film onto a thermally stable receptor, and baking the laminate to remove sacrificial materials and deposit the oriented nanomaterials on the receptor surface. The oriented nanowires can be useful for nanoelectronic devices (e.g., thin film transistors), optical devices (e.g., wire grid polarizers), and electrical devices (e.g., anistropic conductive films), or other applications.

Structured lamination transfer films and methods are disclosed in U.S. Patent Application Publication No. 2014/0021492, which is incorporated herein by reference as if fully set forth. U.S. patent application Ser. No. 13/778,276, entitled "Lamination Transfer Films for Forming Embedded Nanostructures," and filed Feb. 27, 2013, which is incorporated herein by reference as if fully set forth, describes the use of high refractive index nanoparticles (e.g. nanozirconia or nanotitania) within the microstructured sacrificial template layer. The high index particles do not volatilize during the bake out of the sacrificial material and instead thermally sinter in random order above the structured siloxane coating.

In this disclosure:

"backfill layers" or "structured backfill layers" refers to layers of thermally stable materials that fill in irregular or structured surfaces to produce a new surface that may be used as a base to build additional layered elements or template inorganic nanomaterials;

"backfill materials" refers to thermally stable materials used for backfill layers or structured backfill layers;

"nanostructures" refers to features that range from about 1 nm to about 1000 µm in their longest dimension and includes microstructures;

"structured surface" refers to a surface that includes nanostructures that can be in a regular pattern or random across the surface;

"monodisperse nanoparticles" refers to a size range of nanoparticles that are within 10 to 15% of a nominal diameter;

"bake-out" refers to the process of substantially removing sacrificial material present in a layer by pyrolysis, combustion, sublimation, or vaporization without leaving a substantial amount of residual material such as ash;

"bake-out temperature" refers to the maximum temperature reached during the process of substantially removing sacrificial materials in a layer by pyrolysis or combustion, sublimation, or vaporization;

"combust" or "combustion" refers to a process of heating a layer that comprises organic materials in an oxidizing atmosphere so that organic materials undergo a chemical reaction with the oxidant;

"pyrolyze" or "pyrolysis" refers to a process of heating a sacrificial layer in an inert atmosphere so that organic materials in the article decompose;

"thermally stable" refers to materials that remain substantially intact during the removal of sacrificial materials, materials that can be densified and/or chemically transformed to form inorganic materials;

"polysiloxanes" refers to highly branched oligomeric or polymeric organosilicon compounds and may include carbon-carbon and/or carbon-hydrogen bonds while still being considered as inorganic compounds;

"index of refraction," "refractive index," "index," or "RI", refers to a refractive index of a material in the plane of the material with respect to light at 633 nm and normal or near normal (i.e. 8 degrees) incidence, unless otherwise indicated;

"high refractive index" and "low refractive index" are relative terms; when two layers are compared in both in-plane directions of interest, the layer that has a greater average in-plane refractive index is the high refractive index layer, and the layer that has a lower average in-plane refractive index is the low refractive index layer; and "sacrificial template layer" is the layer that imparts structure to the backfill layer and can be baked out.

Figure 1:
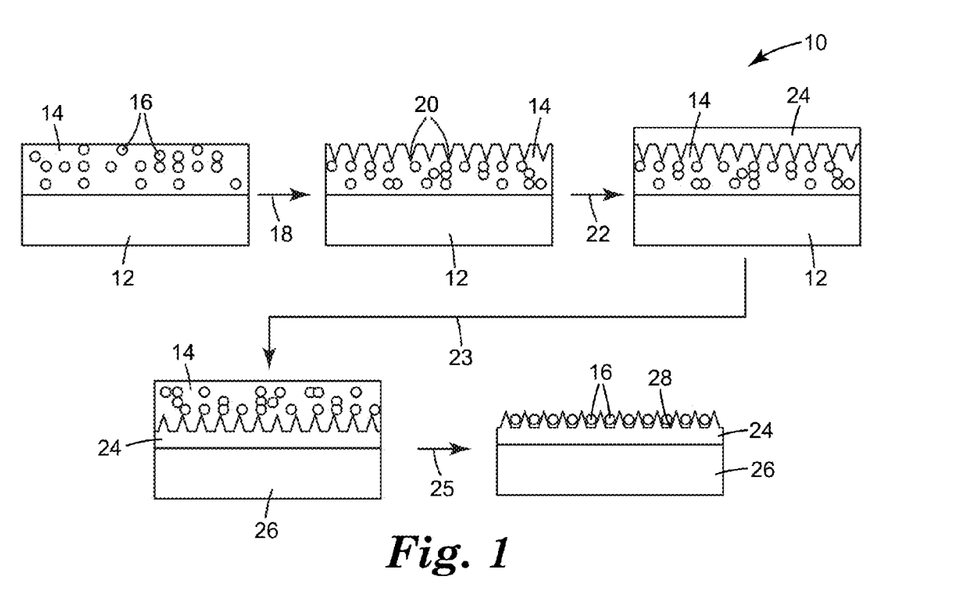
FIG. 1 is a diagram of a transfer film and pyrolysis method for production of a monolayer of nanoparticles aligned in a one-dimensional periodic structure.

FIG. 1 is a diagram of a transfer film and bake-out method 10 for production of a monolayer of nanoparticles aligned in a one-dimensional periodic structure. This transfer film includes monodispersed nanoparticles 16 in a sacrificial resin 14 on a carrier substrate 12. The transfer film has a structured surface 20 imparted on sacrificial resin 14 (step 18), for example through embossing or a continuous cast and cure process. Structured surface 20 is backfilled with a backfill layer material 24 (step 22). The transfer film with backfill layer 24 is laminated to a thermally stable receptor substrate 26 with the backfill layer against the thermally stable receptor substrate, and carrier substrate 12 is removed (step 23). Sacrificial resin 14 is baked-out to produce a template monolayer of nanoparticles 16 aligned within a one-dimensional periodic structure 28 on backfill layer 24 and corresponding with the inverse of the structured surface 20 (step 25). In this embodiment, a diameter of nanoparticles 16 is on the order of a width of periodic structure 28. Method 10 can optionally be implemented without a transfer film by starting with monodisperse nanoparticles 16 in sacrificial resin 14 applied to structured backfill layer 24 on thermally stable receptor substrate 26, and then baking out sacrificial resin 14 in step 25.

Figure 2:
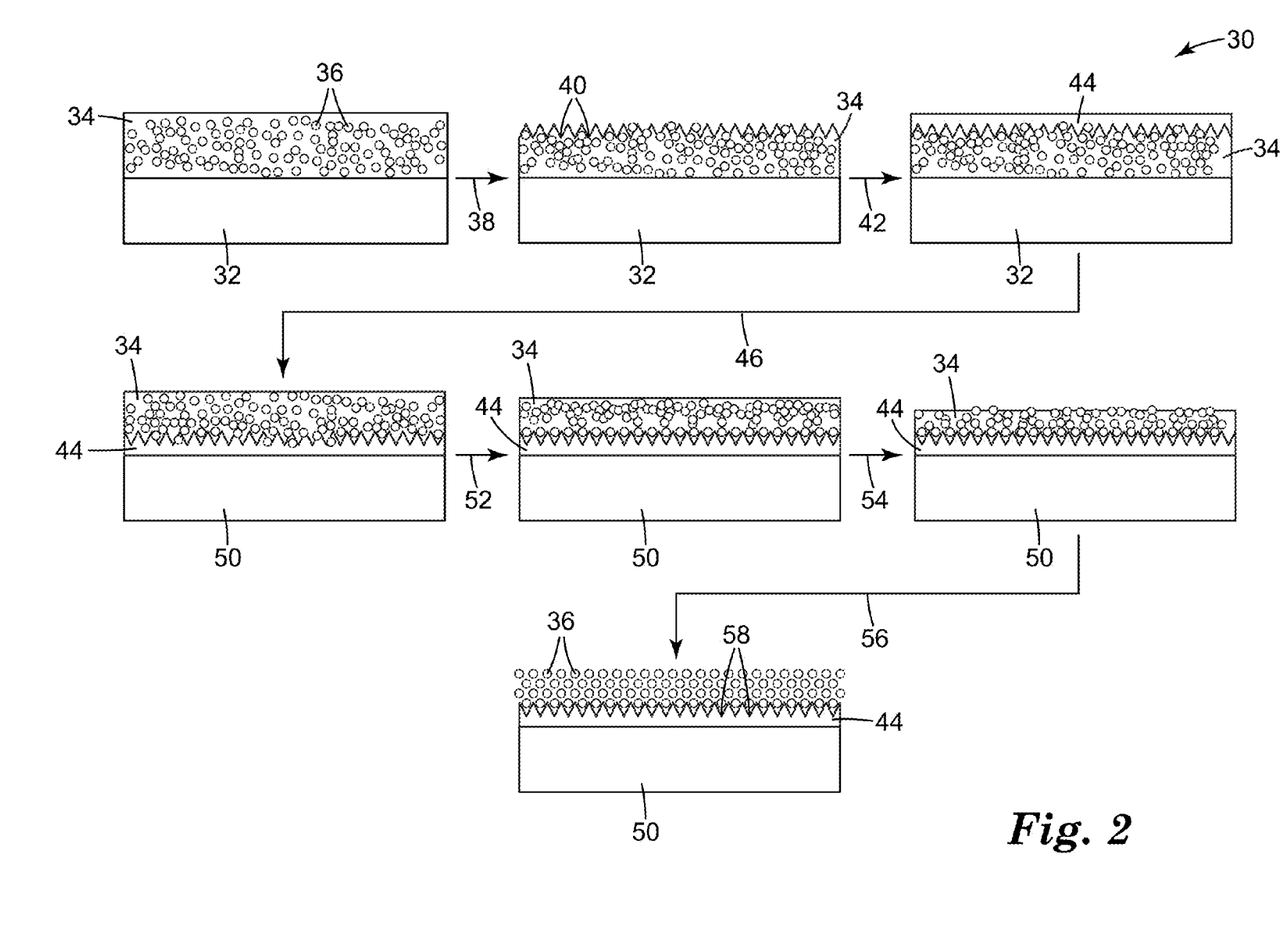
FIG. 2 is a diagram of a transfer film and pyrolysis method for photonic crystal assembly in a one-dimensional periodic structure.

FIG. 2 is a diagram of a transfer film and hake-out method 30 for photonic crystal assembly in a one-dimensional periodic structure. This transfer film includes monodispersed nanoparticles 36 in a sacrificial resin 34 on a carrier substrate 32. The transfer film has a structured surface 40 imparted on sacrificial resin 34 (step 38), for example through an embossing or a continuous cast and cure process. The structured surface is backfilled with a thermally stable material 44 (step 42). The transfer film with backfill layer 44 is laminated to a thermally stable receptor substrate 50 with the backfill layer against the thermally stable receptor substrate, and carrier substrate 32 is removed (step 46). Sacrificial resin 34 is baked out (step 52) to produce templating of nanoparticles 36 (step 54) and colloidal epitaxial growth of a nanoparticle layer (step 56) from the one-dimensional periodic structure 58 of an resulting in an ordered multilayer or photonic crystal structure of nanoparticles 36. The one-dimensional periodic structure 58 corresponds with the inverse of the structured surface 40.

Figure 3:
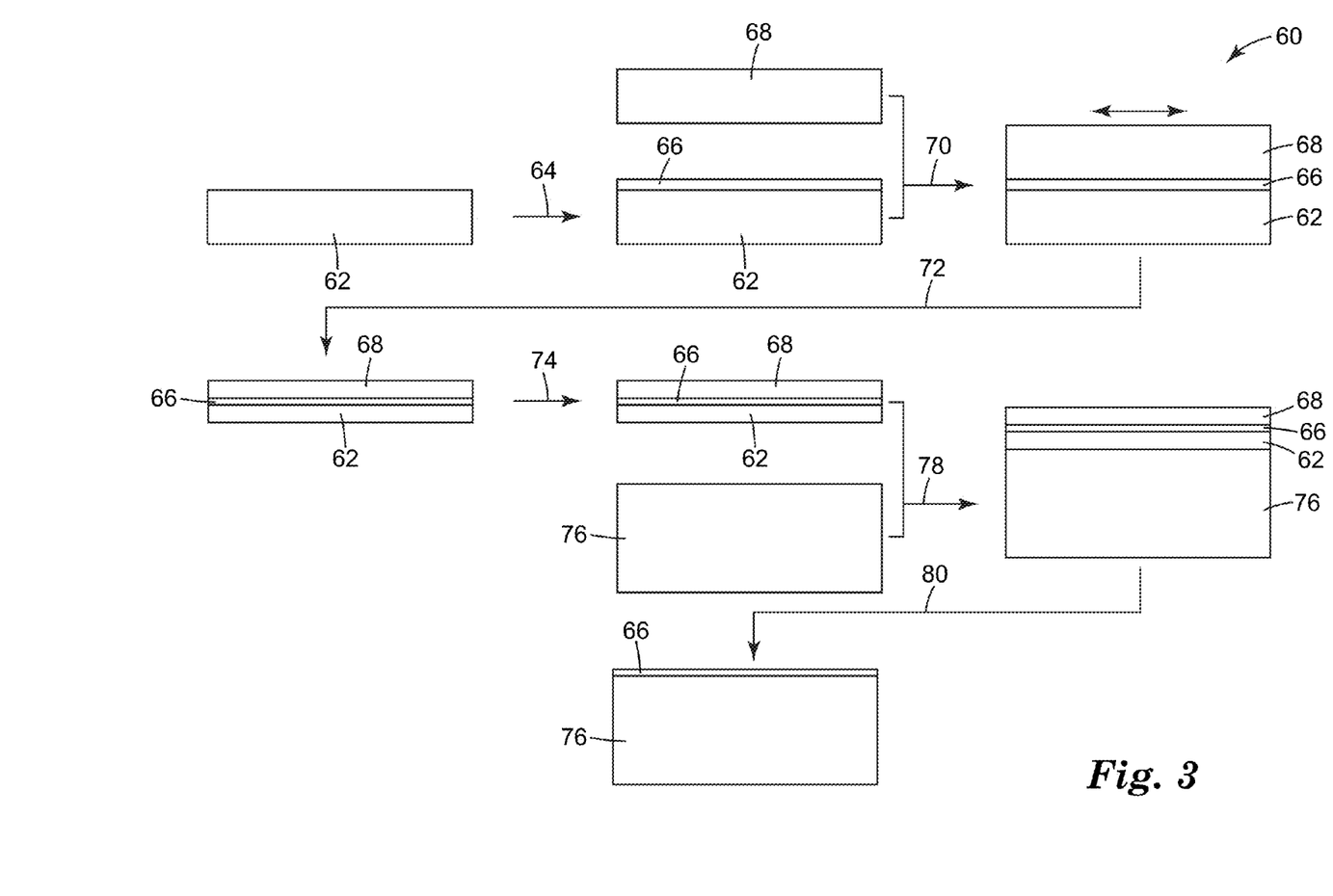
FIG. 3 is a diagram of a transfer film and method for forming aligned nanowires.

FIG. 3 is a diagram of a transfer film and method 60 for forming aligned nanowires. This transfer film includes a sacrificial thermoplastic substrate 62, which is coated with a nanowire formulation 66 (step 64). Another sacrificial thermoplastic substrate 68 is laminated to substrate 62 with nanowire formulation 66 between the substrates (step 70). Substrate 68 is optional in that the nanowire formulation can be coated on a single substrate instead of being laminated between two substrates. The composite assembly of substrates 62 and 68 with nanowire formulation 66 is uniaxially stretched under a heat treatment (steps 72 and 74). The resulting assembly is laminated to a thermally stable receptor substrate 76 (step 78). The sacrificial thermoplastic substrates 62 and 68 are baked-out to produce aligned nanowires 66 on thermally stable receptor substrate 76 (step 80).

Figure 4:
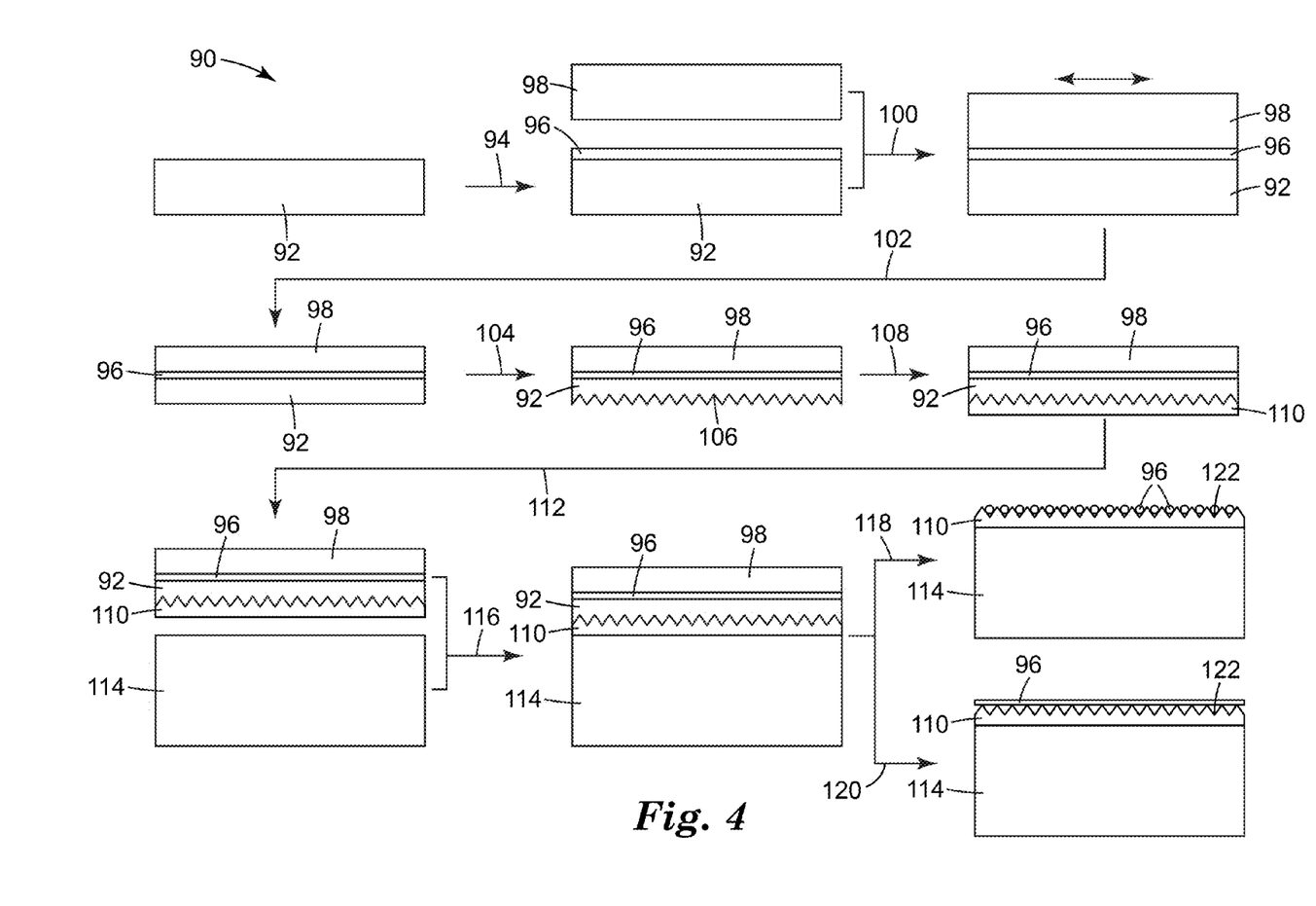
FIG. 4 is a diagram of a transfer film and method for forming aligned and template self-assembled nanowires.

FIG. 4 is a diagram of a transfer film and method 90 for forming aligned and templated self-assembled nanowires. This transfer film includes a sacrificial thermoplastic substrate 92, which is coated with a nanowire formulation 96 (step 94). Another sacrificial thermoplastic substrate 98 is laminated to substrate 92 with nanowire formulation 96 between the substrates (step 100). Substrate 98 is optional in that the nanowire formulation can be coated on a single substrate instead of being laminated between two substrates. The composite assembly of substrates 92 and 98 with nanowire formulation 96 is uniaxially stretched under a heat treatment (steps 102 and 104). The stretched composite assembly of substrates 92 and 98 with nanowire formulation 96 is embossed to produce a structured surface 106 on substrate 92 (step 104). The embossed structure may be parallel or perpendicular to the stretching direction or be arranged at any angle between parallel or perpendicular to the stretching direction. Structured surface 106 is backfilled with a thermally stable material 110 (step 108). The composite assembly of substrates 92 and 98, nanowire formulation 96, and backfill layer 110 is laminated to a thermally stable receptor substrate 114 with backfill layer 110 against thermally stable receptor substrate 114 (steps 112 and 116). The substrates 92 and 98 of the resulting assembly are baked-out (steps 118 and 120). resulting in aligned parallel and perpendicular, respectively, templated nanowires 96 on structured surface 122 of backfill layer 110 on thermally stable receptor substrate 114, where structured surface 122 corresponds with the inverse of the structured surface 106.

The following describes exemplary materials for the transfer films and methods.

Support Substrates

The support substrate or carrier substrate can be embodied as a flexible film providing mechanical support for the other layers. One example of a carrier film is polyethylene terephthalate (PET). Various polymeric film substrates comprised of various thermosetting or thermoplastic polymers are suitable for use as the support substrate. The carrier may be a single layer or multi-layer film.

In some embodiments, the support substrate can include sacrificial materials. Sacrificial materials, typically sacrificial layers, can be pyrolyzed by subjecting them to thermal conditions that can vaporize substantially all of the organic material present in the sacrificial layers. Sacrificial layers can also he subjected to combustion to burn out all of the organic material present in the sacrificial layer. Typically, a clear, high-purity polymer, such as poly(methyl methacrylate), poly(ethyl acrylate-co-methyl methacrylate), can be used as the sacrificial material. Useful sacrificial materials leave very low organic residuals (ash) after pyrolysis or combustion at the bake-out temperature.

In some embodiments, the sacrificial support substrate of a disclosed transfer film can be coated with a releasable material on one surface. Reduction of the adhesion of the support substrate to any layer applied to it can be accomplished by application of a release coating to the support substrate. Release coatings can be applied to the surface of the support substrate with, for example, plasma deposition or vacuum deposition, or it can be a polymer with a low adhesion force to the substrate. After making the rest of the transfer film and laminating the transfer film to a receptor to form a laminate, the sacrificial support substrate can be removed from the laminate by peeling it away from the surface which it is supporting in the transfer film. In this embodiment, the sacrificial support material need not be pyrolyzed or combusted to be removed and can include any of the materials described above as support substrate materials. The sacrificial template layer can be formed through embossing, replication processes, extrusion, casting, or surface structuring, for example.

The structured surface can include nanostructures, microstructures, or hierarchical structures. Nanostructures comprise features having at least one dimension (e.g., height, width, or length) less than or equal to one micron. Microstructures comprise features having at least one dimension (e.g., height, width, or length) less than or equal to one millimeter. Hierarchical structures are combinations of nanostructures and microstructures. In some embodiments, the sacrificial template layer can be compatible with patterning, actinic patterning, embossing, extruding, and coextruding. The nanostructures and microstructures can be one-dimensional or two-dimensional. Examples of one-dimensional nanostructures and microstructures include continuous or elongated prisms or ridges, or linear gratings. Examples of two-dimensional nanostructures and microstructures include lenslets, pyramids, trapezoids, round or square shaped posts, or photonic crystal structures.

Sacrificial Materials

Sacrificial materials earl include an organic component, such as a polymer and/or binder. The organic component of either sacrificial layer is capable of being pyrolyzed, combusted, or otherwise substantially removed while leaving any adjacent layer, including structured surfaces, substantially intact. The adjacent layer can include, for example, a backfill layer having a structured surface or two layers having a structured surface between them. The sacrificial layer can have a structured surface formed through embossing, a replication process, extrusion, casting, or surface structuring, for example.

In some embodiments, inorganic nanomaterials may be dispersed in the sacrificial layer. These sacrificial layers comprise a sacrificial materials component (e.g. a sacrificial polymer such as PMMA) and may further comprise a thermally stable materials component (e.g. an inorganic nanomaterial, an inorganic binder, or thermally stable polymer). Bake-out of the laminate article involves the decomposition of sacrificial material in sacrificial film or layer(s) while leaving the thermally stable materials component(s) substantially intact. The sacrificial materials component of sacrificial template or the sacrificial support substrate composition may vary from 1 to 99.9 wt % of the total solids of the formulation, or preferably from 1 to 40 wt % by weight of the total solids of the formulation.

Materials that may be used for the sacrificial layer include polyvinyl alcohol (PVA), ethylcellulose, methylcellulose, polynorbornes, poly(methylmethacrylate (PMMA), poly(vinylbutyral), poly(cyclohexene carbonate), poly(cyclohexene propylene)carbonate, poly(ethylene carbonate)poly(propylene carbonate) and other aliphatic polycarbonates. Examples of these materials are listed in Table 1. These materials are typically easy to remove via dissolution or thermal decomposition via pyrolysis or combustion. Thermal heating is typically part of man manufacturing processes and thus removal of the sacrificial material may be accomplished during an existing heating step. For this reason, thermal decomposition via pyrolysis or combustion is a more preferred method of removal. Sacrificial material should be capable of being coated onto a carrier or support substrate via extrusion, knife coating, solvent coating, cast and cure, or other typical coating methods.

The decomposition temperature of the sacrificial material should be above the curing temperature of the backfill material(s). Once the backfill material is cured, the structure is permanently formed and the sacrificial template layer can be removed via any one of the methods listed above. Materials that thermally decompose with low ash or low total residue at the bake-out temperature are preferred over those that have higher residuals. Residue left behind on a substrate may adversely impact optical properties such as the transparency or color of the final product. Since it is desirable to minimize any changes to these properties in the final product, residual levels of less than 1000 ppm at the bake-out temperature are preferred. Residuals levels of less than 500 ppm at the bake-out temperature are more preferred and residual level below 50 ppm at the bake-out temperature are most preferred. The sacrificial component(s) of the sacrificial layer(s) can be removed by pyrolysis or combustion without leaving a substantial amount of residual material such as ash at the bake-out temperature. Examples of preferred residual levels are provided above, although different residual levels can be used depending upon a particular application. It is also important that the decomposition of the sacrificial materials should be at a bake-out temperature that does not significantly change the physical properties of the receptor substrate.

The sacrificial layer can comprise any material as long as the desired properties are obtained. Preferably, the sacrificial layer is made from a polymerizable composition comprising polymers having number average molecular weights of about 1.000 Da or less (e.g., monomers and oligomers). Particularly suitable monomers or oligomers have molecular weights of about 500 Da or less, and even more particularly suitable polymerizable molecules have molecular weights of about 200 Da or less. Said polymerizable compositions are typically cured using actinic radiation, e.g., visible light, ultraviolet radiation, electron beam radiation, heat and combinations thereof, or any of a variety of conventional anionic, cationic, free radical or other polymerization techniques, which can be photochemically or thermally initiated.

Useful polymerizable compositions comprise curable functional groups known in the art, such as epoxide groups, allyloxy groups, (meth)acrylate groups, epoxide, vinyl, hydroxyl, acetoxy, carboxylic acid, amino, phenolic, aldehyde, cinnamate, alkene, alkyne, ethylenically unsaturated groups, vinyl ether groups, and any derivatives and any chemically compatible combinations thereof.

The polymerizable composition used to prepare the sacrificial template layer may be monofunctional or multifunctional (e.g. di-, tri-, and tetra-) in terms of radiation curable moieties. Examples of suitable monofunctional polymerizable precursors include styrene, alpha-methylstyrene, substituted styrene, vinyl esters, vinyl ethers, octyl(meth)acrylate, nonylphenol ethoxylate(meth)acrylate, isobornyl(meth)acrylate, isononyl(meth)acrylate, 2-(2-ethoxyethoxy)ethyl (meth)acrylate, 2-ethylhexyl(meth)acrylate, lauryl(meth)acrylate, beta-carboxyethyl(meth)acrylate, isobutyl(meth)acrylate, cycloaliphatic epoxide, alpha-epoxide, 2-hydroxyethyl(meth)acrylate, isodecyl(meth)acrylate, dodecyl(meth)acrylate, n-butyl(meth)acrylate, methyl (meth)acrylate, hexyl(meth)acrylate, (meth)acrylic acid, N-vinylcaprolactam, stearyl(meth)acrylate, hydroxyl functional caprolactone ester(meth)acrylate, isooctyl(meth)acrylate, hydroxyethyl(meth)acrylate, hydroxypropyl(meth)acrylate, hydroxyisopropyl(meth)acrylate, hydroxybutyl (meth)acrylate, hydroxyisobutyl(meth)acrylate, tetrahydrofuryl(meth)acrylate, and any combinations thereof.

Examples of suitable multifunctional polymerizable precursors include ethyl glycol di(meth)acrylate, hexanediol di(meth)acrylate, triethylene glycol di(meth)acrylate, tetraethylene glycol di(meth)acrylate, trimethylolpropane tri(meth)acrylate, trimethylolpropanepropane tri(meth)acrylate, glycerol tri(meth)acrylate, pentaerythritol tri(meth)acrylate, pentaerythritol tetra(meth)acrylate, neopentyl glycol di(meth)acrylate, bisphenol A di(meth)acrylate, poly (1,4-butanediol) di(meth)acrylate, any substituted, ethoxylated or propoxylated versions of the materials listed above, or any combinations thereof. The polymerization reactions generally lead to the formation of a three-dimensional "crosslinked" macromolecular network and are also known in the art as negative-tone photoresists, as reviewed by Shaw et al., "Negative photoresists for optical lithography," IBM Journal of Research and Development (1997) 41, 81-94. The formation of the network may occur through either covalent, ionic, or hydrogen bonding, or through physical crosslinking mechanisms such as chain entanglement. The reactions can also be initiated through one or more intermediate species, such as free-radical generating photoinitiators, photosensitizers, photoacid generators, photobase generators, or thermal acid generators. The type of curing agent used depends on the polymerizable precursor used and on the wavelength of the radiation used to cure the polymerizable precursor. Examples of suitable commercially available free-radical generating photoinitiators include benzophenone, benzoin ether, and acylphosphine photoinitiators, such as those sold under the trade designations "IRGACURE" and "DAROCUR" from Ciba Specialty Chemicals, Tarrytown, N.Y. Other exemplary photoinitiators include, 2,2-dimethoxy-2-phenylacetophenone (DMPAP), 2,2-dimethoxyaretophenone (DMAP), xanthone, and thioxanthone.

Co-initiators and amine synergists may also be included to improve curing rates. Suitable concentrations of the curing agent in the crosslinking matrix range from about 1 wt. % to about 10 wt. %, with particularly suitable concentrations ranging from about 1 wt. % to about 5 wt. %, based on the entire weight of the polymerizable precursor. The polymerizable precursor may also include optional additives, such as heat stabilizers, ultraviolet light stabilizers, free-radical scavengers, and combinations thereof. Examples of suitable commercially available ultraviolet light stabilizers include benzophenone-type ultraviolet absorbers, which are available under the trade designation "UVINOL 400" from BASF Corp., Parsippany, N.J.; under the trade designation "CYASORB UV-1164" from Cytec Industries, West Patterson, N.J.; and under the trade designations "TINUVIN 900," "TINUVIN 123" and "TINUVIN 1130" from Ciba Specialty Chemicals, Tarrytown, N.Y. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 292" from Ciba Specialty Chemicals, Tarrytown, N.Y., and the trade designated "CYASORB UV-24" from Cytec Industries, West Patterson, N.J. Examples of suitable concentrations of free radical scavengers in the polymerizable precursor range from about 0.05 wt. % to about 0.25 wt. %.

Patterned sacrificial template layers can be formed by depositing a layer of a radiation curable composition onto one surface of a radiation transmissive carrier to provide a layer having an exposed surface, contacting a master with a preformed surface bearing a pattern capable of imparting a three-dimensional structure of precisely shaped and located interactive functional discontinuities including distal surface portions and adjacent depressed surface portions into the exposed surface of the layer of radiation curable composition on said carrier under sufficient contact pressure to impart said pattern into said layer, exposing said curable composition to a sufficient level of radiation through the carrier to cure said composition while the layer of radiation curable composition is in contact with the patterned surface of the master. This cast and cure process can be done in a continuous manner using a roll of carrier, depositing a layer of curable material onto the carrier, laminating the curable material against a master and curing the curable material using actinic radiation. The resulting roll of carrier with a patterned, sacrificial template disposed thereon can then be rolled up. This method is disclosed, for example, in U.S. Pat. No. 6,858,253 (Williams et al.).

TABLE 1

Sacrificial Materials

| Material Name or Trade Designation | Type | Available from |
|---|---|---|
| ETHOCEL | Ethylcellulose | Dow Chemical (Midland, MI) |
| FIBERLEASE P.V.A | Polyvinyl alcohol | Fiberlay Inc (Seattle, WA) |
| PARTALL Film #10 | Polyvinyl alcohol | Rexco (Conyers, GA) |
| ASR Series | Polynorbornenes | Promerus (Cleveland, OH) |
| NOVOMER PPC | Polypropylene carbonate | Novomer Inc (Ithaca, NY) |
| QPAC Series | Aliphatic polycarbonates | Empower Materials (New Castle, DE) |
| PDM 1086 | Polynorbornene | Promerus (Cleveland, OH) |
| PVA-236 | Polyvinyl alcohol | Kuraray America Inc. (Houston, TX) |
| SR-540 | Methacrylic monomer | Sartomer (Exton, PA) |

Inorganic Nanomaterials

Inorganic nanomaterials include zero-, one-, two-, and three dimensional inorganic materials comprising particles, rods, sheets, plates, spheres, tubes, wires, cubes, cones, tetrahedrons, or other shapes. One-, two-, and three dimensional inorganic nanomaterials with unequal length, width, and height ratios are dimensionally anisotropic nanomaterials. The amount of the nanomaterial included in the sacrificial layer may vary from 0.1 to 99 wt % of the total solids of the formulation, or preferably from 1 to 60 wt % by weight of the total solids of the formulation.

Nanowires can include, for example, the following: Ag, Si, Cu, Ni-coated Cu, Au-coated Ag, zinc oxide, and tin(IV) oxide nanowires; and single-wall carbon nanotubes and multi-wall carbon nanotubes.

The sacrificial template compositions described herein preferably comprise inorganic particles. These particles can be of various sizes and shapes. The nanoparticles can have an average particle diameter less than about 1000 nm, less than about 100 nm, less than about 50 nm, less than 10 nm, to about 1 nm. The nanoparticles can have an average particle diameter from about 1 nm to about 50 nm, or from about 3 nm to about 35 nm, or from about 5 nm to about 25 nm. Preferably, the nanoparticle diameter is on the same order as the wavelength of light, from 390 nm-700 nm.

The nanoparticles can be treated with a surface treatment agent. Surface-treating the nano-sized particles can provide a stable dispersion in the polymeric resin. Preferably, the surface-treatment stabilizes the nanoparticles so that the particles will be well dispersed in the sacrificial template resin and result in a substantially homogeneous composition. Furthermore, the nanoparticles can be modified over at least a portion of its surface with a surface treatment agent so that the stabilized particle can copolymerize or react with the polymerizable resin during curing. Examples of surface treatment agents include alcohols, amines, carboxylic acids, sulfonic acids, phosphonic acids, silanes and titanates.

Backfill Layer Materials

The backfill layer is a material capable of at least partially filling a structured surface in a layer to which it is applied. The backfill layer can alternatively be a bilayer of two different materials where the bilayer has a layered structure. The two materials for the bilayer can optionally have different indices of refraction. One of the bilayers can optionally comprise an adhesion promoting layer.

Materials that may be used for the backfill include polysiloxane resins, polysilazanes, polyimides, silsesquioxanes of bridge or ladder-type, silicones, and silicone hybrid materials and many others. Exemplary polysiloxane resins include the PERMANEW material, available from California Hardcoating Company, Chula Vista, Calif. Examples of these materials are listed in Table 2. Other classes of materials that may be of use are benzocyclobutenes, soluble polyimides, and polysilazane resins, for example.

In many embodiments, the thermally stable backfill materials useful in the current invention belong to a class of the highly branched organosilicon oligomers and polymers of a general formula (as below) which can be further reacted to form crosslinked networks by homo-condensation of Si—OH groups, hetero-condensation with the remaining hydrolyzable groups (e.g. alkoxy), and/or by reactions of the functional organic groups (e.g. ethylenically unsaturated). This class of materials is derived primarily from organosilanes of a general formula:

$$R_x SiZ_{4-x},$$

wherein

R is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these.

Z is a hydrolyzable group, such as halogen (containing the elements F, Br, Cl, or I), $C_1$-$C_{20}$ alkoxy, $C_5$-$C_{20}$ aryloxy, and/or combinations of these.

The majority of the composition may consist of $RSiO_{3/2}$ units thus the class of materials is often called silsesquioxanes (or T-resins), however they may also contain mono- ($R_3Si$—$O_{1/2}$), di-($R_2SiO_{2/2}$) and tetrafunctional groups ($Si$—$O_{4/2}$). Organically-modified disilanes of the formula:

$$Z_{3-n}R_nSi\text{—}Y\text{—}SiR_nZ_{3-n}$$

are often used in the hydrolyzable compositions to further modify the properties of the materials (to form the so-called bridged silsesquioxanes), the R and Z groups are defined above. The materials can be further formulated and reacted with metal alkoxides ($M(OR)_m$) to form metallo-silsesquioxanes.

In many embodiments the highly branched organosilicon oligomers and polymers of a general formula:

$R_1$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_2$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group and/or combinations of these;

$R_3$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_4$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

$R_5$ is selected from hydrogen, substituted or unsubstituted $C_1$-$C_{20}$ alkyl, substituted or unsubstituted $C_2$-$C_{10}$ alkylene, substituted or unsubstituted $C_2$-$C_{20}$ alkenylene, $C_2$-$C_{20}$ alkynylene, substituted or unsubstituted $C_3$-$C_{20}$ cycloalkyl, substituted or unsubstituted $C_6$-$C_{20}$ aryl, substituted or unsubstituted $C_6$-$C_{20}$ arylene, a substituted or unsubstituted $C_7$ to $C_{20}$ arylalkyl group, a substituted or unsubstituted $C_1$ to $C_{20}$ heteroalkyl group, a substituted or unsubstituted $C_2$ to $C_{20}$ heterocycloalkyl group, and/or combinations of these;

Z is a hydrolyzable group, such as halogen (containing the elements F, Br, Cl, or I), $C_1$-$C_{20}$ alkoxy, C-$C_{20}$ aryloxy, and/or combinations of these.

m is an integer from 0 to 500;
n is an integer from 1 to 500;
p is an integer from 0 to 500;
q is an integer from 0 to 100.

As used herein, the term "substituted" refers to one substituted with at least a substituent selected from the group consisting of a halogen (containing the elements F, Br, Cl, or I), a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid group or a salt thereof, alkyl group, a $C_2$ to $C_{20}$ alkenyl group, a $C_2$ to $C_{20}$ alkynyl group, $C_6$ to $C_{30}$ aryl group, a $C_7$ to $C_{13}$ arylalkyl group, a $C_1$ to $C_4$ oxyalkyl group, a $C_1$ to $C_{20}$ heteroalkyl group, a $C_3$ to $C_{20}$ heteroarylalkyl group, a $C_3$ to $C_{30}$ cycloalkyl group, a $C_3$ to $C_{15}$ cycloalkenyl group, a $C_6$ to $C_{15}$ cycloalkynyl group, a heterocycloalkyl group, and a combination thereof, instead of hydrogen of a compound.

The resulting highly branched organosilicon polymer has a molecular weight in a range from 150 to 300,000 Da or preferably in a range from 150 to 30,000 Da.

Preferably, the thermally stable backfill contains the reaction product of the hydrolysis and condensation of a methyltriethoxysilane precursor in a polar solvent. After synthesis, the resulting polymer preferably has a molecular weight of nominally less than 30,000 Da. The thermally stable backfill solution also preferably includes less than fifty percent by weight silica nanoparticles nominally of a size between 10-50 nanometers.

The thermally stable compositions described herein preferably comprise inorganic nanoparticles. These nanoparticles can be of various sizes and shapes. The nanoparticles can have an average particle diameter less than about 1000 nm, less than about 100 nm, less than about 50 nm, or from 5 nm to about 3 nm to about 50 nm. The nanoparticles can have an average particle diameter from about 3 nm to about 50 nm, or from about 3 nm to about 35 nm, or from about 5 nm to about 25 nm. If the nanoparticles are aggregated, the maximum cross sectional dimension of the aggregated particle can be within any of these ranges, and can also be greater than about 100 nm. "Fumed" nanoparticles, such as silica and alumina, with primary size less than about 50 nm, may also be used, such as CAB-OSPERSE PG 002 fumed silica, CAB-O-SPERSE 2017A fumed silica, and CAB-OSPERSE PG 003 fumed alumina, available from Cabot Co. Boston, Mass. Their measurements can be based on transmission electron microscopy (TEM). Nanoparticles can be substantially fully condensed. Fully condensed nanoparticles, such as the colloidal silicas, typically have substantially no hydroxyls in their interiors. Non-silica containing fully condensed nanoparticles typically have a degree of crystallinity (measured as isolated particles) greater than 55%, preferably greater than 60%, and more preferably greater than 70%. For example, the degree of crystallinity can range up to about 86% or greater. The degree of crystallinity can be determined by X-ray diffraction techniques. Condensed crystalline (e.g. zirconia) nanoparticles have a high refractive index whereas amorphous nanoparticles typically have a lower refractive index. Various shapes of the inorganic or organic nanoparticles may be used, such as sphere, rod, sheet, tube, wire, cube, cone, tetrahedron, and the like.

The size of the particles is generally chosen to avoid significant visible light scattering in the final article. The nanomaterial selected can impart various optical properties (i.e refractive index, birefringence), electrical properties (e.g conductivity), mechanical properties (e.g toughness, pencil hardness, scratch resistance) or a combination of these properties. It may be desirable to use a mix of organic and inorganic oxide particle types to optimize an optical or material property and to lower total composition cost.

Examples of suitable inorganic nanoparticles include metal nanoparticles or their respective oxides, including the elements zirconium (Zr), titanium (Ti), hafnium (Hf), aluminum (Al), iron (Fe), vanadium (V), antimony (Sb), tin (Sn), gold (Au), copper (Cu), gallium (Ga), indium (In), chromium (Cr), manganese (Mn), cobalt (Co), nickel (Ni), zinc (Zn), yttrium (Y), niobium (Nb), molybdenum (Mo), technetium (Te), ruthenium (Ru), rhodium (Rh), palladium (Pd), silver (Ag), cadmium (Cd), lanthanum (La), tantalum (Ta), tungsten (W), rhenium (Rh), osmium (Os), iridium (Ir), platinum (Pt), and any combinations thereof.

TABLE 2

Thermally Stable Backfill Materials of Low and High Refractive Index

| Material Name or Trade Designation | Type | Available from |
|---|---|---|
| TecheGlas GRx resins | T-resin (methyl silsesquioxane) | TechneGlas (Perrysburg, Ohio) |
| HSG-510 | T-resin (methyl silsesquioxane) | Hitachi Chemical (Tokyo, Japan) |
| ACCUGLASS 211 | T-Q resin (methyl silsesquioxane) | Honeywell (Tempe, AZ) |
| HARDSIL AM | silica nanocomposite | Gelest Inc (Morrisville, PA) |
| MTMS-BTSE Copolymer (Ro et. al, Adv. Mater. 2007, 19, 705-710) | bridged silsesquioxane | National Institute of Standards and Technology (Gaithersburg, MD) |
| PERMANEW | silica-filled methyl-polysiloxane polymer containing a latent heat-cure catalyst system | California Hardcoat (Chula Vista, CA) |
| FOX Flowable OXide | hydrogen silsesquioxane | Dow Corning (Midland, MI) |
| ORMOCER, ORMOCLAD, ORMOCORE | silicone hybrid | Micro Resist GmBH (Berlin, Germany) |
| SILECS SCx resins | silicone hybrid (n = 1.85) | Silecs Oy (Espoo, Finland) |
| OPTINDEX D1 | soluble polyimide (n = 1.8) | Brewer Science (Rolla, MO) |
| CORIN XLS resins | soluble polyimide | NeXolve Corp. (Huntsville, AL) |
| CERASET resins | polysilazanes | KiON Specialty Polymers (Charlotte, NC) |
| BOLTON metals | low melting metal | Bolton Metal Products (Bellafonte, PA) |
| CYCLOTENE resins | benzocyclobutane polymers | Dow Chemical (Midland, MI) |
| OPTINDEX A54 | Metal-oxide precursor capped with organic ligands | Brewer Science (Rolla, MO) |

Release Liners

The backfill layer can, optionally, be covered with a temporary release liner. The release liner can protect the patterned structured backfill during handling and can be easily removed, when desired, for transfer of the structured backfill or part of the structured backfill to a receptor. Exemplary liners useful for the disclosed patterned structured film are disclosed in PCT Patent Application Publication No. WO 2012/082536.

The liner may he flexible or rigid. Preferably, it is flexible. A suitable liner (preferably, a flexible liner) is typically at least 0.5 mil (12.6 µm) thick, and typically no more than 20 mils (508 µm) thick. The liner may be a backing with a release coating disposed on its first surface. Optionally, a release coating can be disposed on its second surface. If this backing is used in a transfer article that is in the form of a roll, the second release coating has a lower release value than the first release coating. Suitable materials that can function as a rigid liner include metals, metal alloys, metal-matrix composites, metalized plastics, inorganic glasses and vitrified organic resins, formed ceramics, and polymer matrix reinforced composites.

Receptors

Examples of thermally stable receptor substrates include glass such as display mother glass (e.g., backplane mother glass), lighting mother glass display cover glass, architectural glass, plate glass, roll glass, and flexible glass (can be used in roll to roll processes). An example of flexible roll glass is the WILLOW glass product from Corning Incorporated (Corning, N.Y.). Other examples of receptors include the following: metals such as metal sheets and foils; sapphire, quartz, silicon, silica, and silicon carbide; and fibers, nonwovens, fabric, and ceramics. Receptors also may include, automotive glass, sheet. glass, flexible electronic substrates such as circuitized flexible film, display backplanes, solar glass, flexible glass, metal, polymers, polymer composites, and fiberglass. The receptor substrate can comprise a collector electrode, a transparent conductive oxide coating, a metal foil layer or coating, or a conductive thin film coating such as a thin metal film, a metal nanowire coating, a conductive polymer coating, a carbon nanotube coating, a graphene coating, or a carbon black coating. Other exemplary receptors include semiconductor materials on a support wafer as well as crystalline support wafers such as crystalline silicon, crystalline gallium nitride, crystalline indium phosphide, and crystalline gallium arsenide. The receptor substrates can be flat, or curved.

EXAMPLES

Example 1

Lamination Transfer Film with Self-Assembled Nanoparticles

Preparation of A-174 Modified 440 nm Silica

In a 500 mL flask, equipped with a condenser and a thermometer, 200 g of MP4540M colloidal solution (Nissan Chemical America. Houston, Tex.) and 200 g of 1-methoxy-2-propanol were mixed together under rapid stirring. 0.6 g of SILQUEST A-174 (Momentive Performance Materials Inc. Friendly, W. Va.) was then added. The mixture was heated to 80' C. for 16 hours. 150 g of additional 1-methoxy-2-propanol was then added. The resulting solution was allowed to cool down to room temperature. Most of the water and 1-methoxypropanol solvents were removed using a rotary evaporator under 60° C. water-bath, resulting in 49.5% by weight A-174 modified 440 nm silica dispersion in 1-methoxy-2-propanol.

Resin Formulation

A 1:9 (w:w) coating solution comprising 440 nm silica was prepared by combining the respective solutions of the functionalized silica nanoparticles (A-174 Modified 440 nm Silica and a sacrificial thermoplastic (QPAC100, Empower Materials, 30% solids in 1,3-Dioxolane).

Release-Coated Structured Template Tooling "Tool A"

A 600 nm structured film template was created using standard cast and cure microreplication, hereby called "Tool A". The substrate is a primed 0.002 inch (0.051 mm) thick PET. The replicating resin is a 75/25 blend of SR 399 and SR238 (both available from Sartomer USA, Exton, Pa.) with a photoinitator package comprising 1% Darocur 1173, 1.9% triethanolamine, and 0.5% OMAN071 (available from Gelest, Inc. Morrisville, Pa.). Replication of the resin is conducted at 20 ft/min (6.1 m/min) with the replication tool temperature at 137° F. (58° C.). Radiation from a Fusion "D" lamp operating at 600 W/in is transmitted through the film to cure the resin while in contact with the tool. The replication tool is patterned with a 600 nm pitch linear sawtooth groove structure. The cured resin is then separated from the tool and wound into a roll.

The replicated template film is primed in a plasma chamber using argon gas at a flow rate of 250 standard cc/min (sccm) at a pressure of 25 mTorr and RF power of 1000 Watts for 30 seconds. Subsequently, a release coated tool surface is prepared by subjecting the samples to a tetramethylsilane (TMS) plasma at a TMS flow rate of 150 SCCM but no added oxygen, which corresponded to an atomic ratio of oxygen to silicon of about 0. The pressure in the plasma chamber is 25 mTorr, and the RF power of 1000 Watts is used for 10 seconds.

Microstructured Sacrificial Template Layer

A 2.5 mil film of the Coating formulation was made by knife coating a 6 mil film of solution on the backside of a 0.051 mm (0.002 inch) thick T50 silicone release liner (commercially available from CP Films, Fieldale, Va.).

Using a heated hydraulic press, the film was embossed onto a 600 nm ID periodic microreplicated "Tool A" film. Optimal embossing was achieved with 2000 psi of compression at 260° C. for 5 minutes. The embossed film was allowed to cool before removing Tool A.

A sample of the film (2 in×3 in—50 mm×75 mm) was coated with the PERMANEW material (California Hardcoating Co., Chula Vista, Calif.), which was applied to the structured film sample by spin coating. Prior to spin coating, the PERMANEW material was diluted to 15 wt % by the addition of isopropanol and filtered through a 1 µm PTFE filter. A glass microscope slide was used to support the film during the spin coating process. The spin parameters were 500 rpm/10 sec (solution application), 2000 rpm/10 sec (spin down), and 500 rpm/10 sec (dry) using a Laurell spin coater (Model #: WS-6505-6npp/lite). The sample was removed from the spin coater and placed on a hotplate at 80° C. for 1 hour to remove the solvent and cure the PERMANEW material to a "green" (not fully cured) state.

Adhesion Promotion Layer Coating

Glass slides, 50 mm×75 mm, were cleaned with IPA and a lint free cloth. The glass slide were hand laminated to an optically clear adhesive (OCA 8171, 3M Co, St. Paul, Minn.).

Lamination

The film stack was laminated at 125° F. (51° C.), PERMANEW material coating side down, to adhesive coated glass slide using a thermal film laminator (GBC Catena 35, GBC Document Finishing, Lincolnshire, Ill.). The laminated sample was removed from the laminator and allowed cool to room temperature.

Bake-Out

After lamination, the release liner supporting the film stack was separated from the film leaving all other layers adhered to the glass slide. The sample was placed in a box furnace (Lindberg Blue M box furnace model BF51732PC-1, Asheville N.C., USA) and brought from 25° C. to 300° C. at a rate of approximately 10° C./min. The furnace was held at 300° C. for thirty minutes, then heated to 500° C. at a rate of approximately 10° C./min and held for one hour. The furnace and sample are then allowed to cool down to ambient temperature.

Figure 5A:
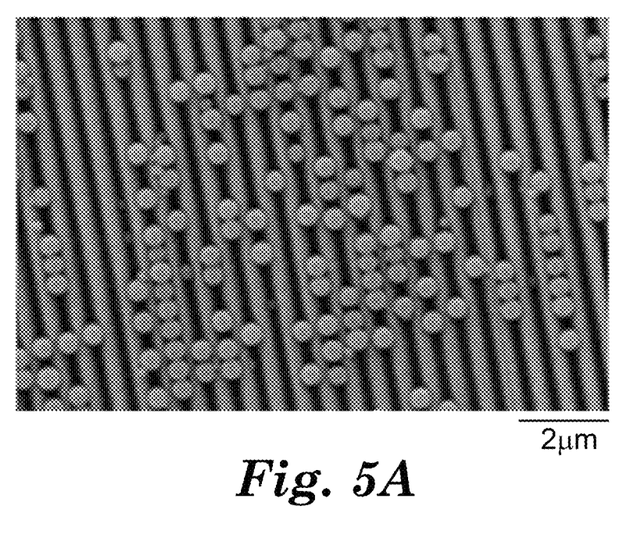
FIGS. 5A and 5B are images of the samples for Example 1.
Figure 5B:
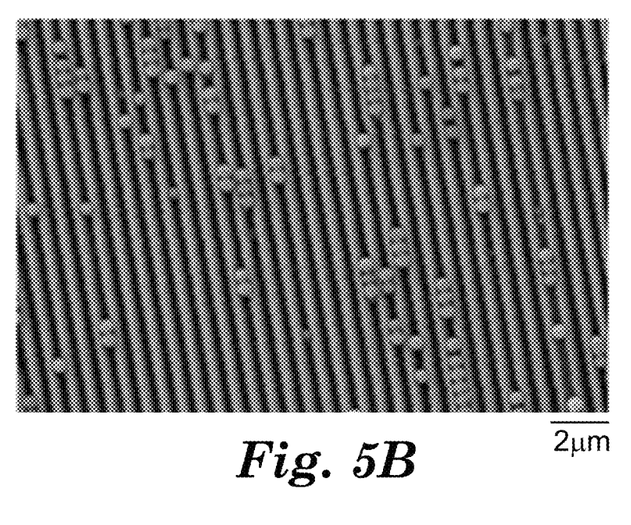

FIGS. 5A and 5B are images of the samples for Example 1.

Example 2

Lamination Transfer Film with Oriented Silver Nanowires on 600 nm Periodic Structure Nanowire Coating Formulation A 99:1 (w:w) coating formulation comprising silver nanowires was prepared by mixing a nanowire dispersion (AgNW-25, 5 mg/ml , Seashell Technologies, La Jolla, Calif.) and an inorganic binder precursor (Silres MK powder, Wacker Chemie AG).

Loading Film

A 0.75 mil film of sacrificial thermoplastic (QPAC100, Empower Materials) was prepared by knife coating a solution of the polymer (QPAC100, Empower Materials, 30 wt % solids in 1,3-dioxolane) on the backside of a 0.051 mm (0.002 inch) thick T50 silicone release liner (commercially available from CP Films, Fieldale, Va.). The surface of the coated sacrificial thermoplastic film was treated with an oxygen-plasma treated for 60 seconds in a vacuum plasma apparatus (Yield Engineering Systems, Inc. YES-G1000). The nanowire formulation was applied to the plasma treated surface using a #4 Mayer bar, resulting in a dry coating thickness of 0.5 microns.

A second, identical film of sacrificial thermoplastic was applied to the coated side of the first film and then pressed using a heated hydraulic press (112° C., 2000 psi) to form a three layer composite film. The release liners were removed prior to the orientation step.

Orientation

The film was stretched in small format film stretching apparatus (Karo IV stretching machine, Brü ckner Maschinenbau GmbH & Co. KG). The film was preheated and stretched in a 75° C. oven and then followed by a 60 second annealing at 80° C. Uniaxial stretching was performed at a rate of 2° C./min and the film was extended by 250% to 400% in 50% increments. The best results were obtained with uniaxial stretching to 350%.

Micro-Structured Film

Using a heated hydraulic press, the stretched film was embossed perpendicular to stretching direction onto a 600 nm 1D grading micro-replicated film perpendicular to the stretching direction. Optimal embossing was achieved with 2000 psi of compression at 260° C. for 5 minutes. The embossed film was allowed to cool before removing from 600 nm grading film.

A sample of the embossed film (2 in×3 in—50 mm×75 mm) was coated with the PERMANEW material, which was applied to the structured film sample by spin coating. Prior to spin coating, the PERMANEW material was diluted to 15 wt % by adding isopropanol and filtered through a 1 μm PTFE filter. A glass microscope slide was used to support the film during the spin coating process. The spin parameters were 500 rpm/10 sec (solution application), 2000 rpm/10 sec (spin down), and 500 rpm/10 sec (dry) using a Laurell (Model #: WS-6505-6npp/lite). The sample was removed from the spin coater and placed on a hotplate at 80° C. for 4 hours to remove the solvent and cure the PERMANEW material to a "green" (not fully cured) state.

Adhesion Promotion Layer Coating

Glass slides, 50 mm×75 mm, were cleaned with IPA and a lint free cloth. The slide was mounted on the vacuum chuck of a Laurell (Model #: WS-6505-6npp/lite) spin coater. A vacuum of 64 kPa (19 inches of Hg) was applied to hold the glass to the chuck. A solution of poly(propylenecarbonate) (QPAC 40, Empower Materials Inc., Ithaca, N.Y.) was diluted to 10 wt % in methylethylketone. Approximately 2-3 mL of the solution was applied to the glass slide during the coating application portion of the spin cycle. The spin coater was programmed for 500 RPM for 10 seconds (coating application step) then 3500 RPM for 10 sec (spin step), then 500 RPM for 10 seconds (dry step).

The slide was then removed from the spin coater and put on a hotplate at 100° C. for 30 minutes and covered with an aluminum tray. The slide was then allowed to cool to room temperature.

Lamination

The film stack was laminated at 125° F. (51° C.), PERMANEW material coating side down, to the QPAC40 coated glass slide using a thermal film laminator (GBC Catena 35, GBC Document Finishing, Lincolnshire, Ill.). The laminated sample was removed from the laminator and allowed cool to room temperature.

Bake-Out

After lamination, the sample was placed in a nitrogen purged furnace (Lindberg Blue M box furnace model 51642-HR, Asheville N.C., USA). The sample was brought from 25° C. to 310° C. at a rate of approximately 10° C./min and held for two hours. The furnace and sample were then allowed to cool down to ambient temperature.

Figure 6A:
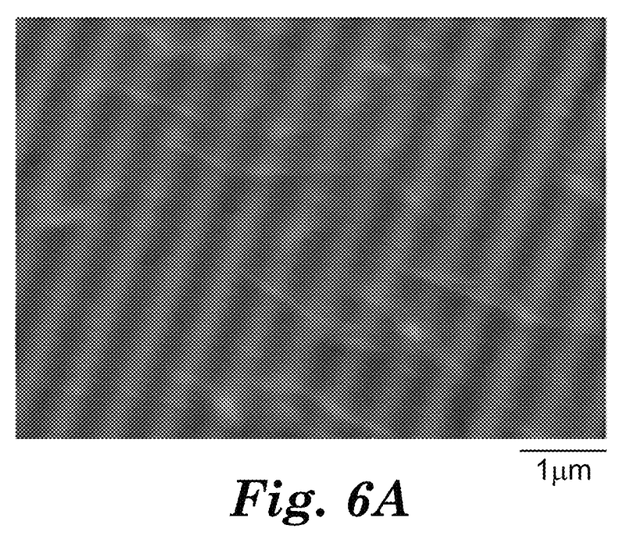
FIGS. 6A and 6B are images of the samples for Example 2.
Figure 6B:
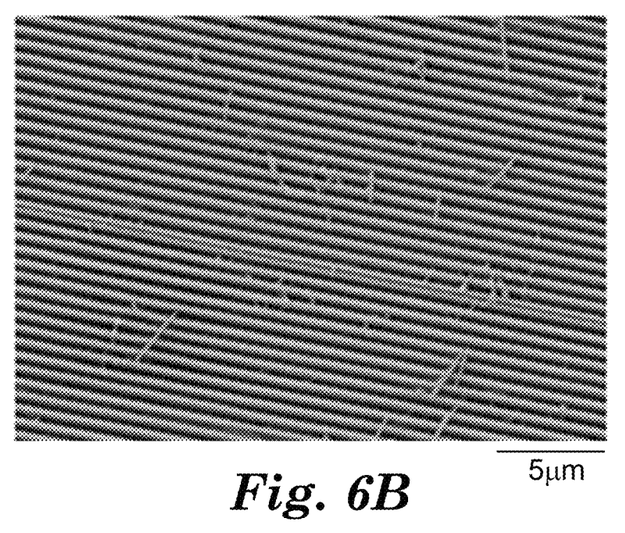

FIGS. 6A and 6B are images of the samples for Example 2.

Example 3

Lamination Transfer Film with Oriented Silver Nanowires on Glass

Nanowire Coating Formation

A 99:1 (w:w) coating formulation comprising silver nanowires was prepared by mixing a nanowire dispersion (AgNW-25, 5 mg/ml, Seashell Technologies, La Jolla, Calif.) and an inorganic binder precursor (Silres MK powder, Wacker Chemie AG).

Loading Film

A 0.75 mil film of sacrificial thermoplastic (QPAC 100, Empower Materials) was prepared by knife coating a solution of the polymer (QPAC100, Empower Materials, 30 wt % solids in 1,3-dioxolane) on the backside of a 0.051 mm (0.002 inch) thick T50 silicone release liner (commercially available from CP Films, Fieldale, Va.). The surface of the coated sacrificial thermoplastic film was treated with an oxygen-plasma treated for 60 seconds in a vacuum plasma apparatus (Yield Engineering Systems, Inc. YES-G1000). The nanowire formulation was applied to the plasma treated surface using a #4 Mayer rod, resulting in a dry coating thickness of 0.5 microns.

A second, identical film of sacrificial thermoplastic was applied to the coated side of the first film and then pressed using a heated hydraulic press (112° C., 2000 psi) to form a three layer composite film. The release liners were removed.

Orientation

The film was stretched in small format film stretching apparatus (Karo IV stretching machine, Brü ckner Maschinenbau GmbH & Co. KG). The film was preheated and stretched in a 75° C. oven and then followed by a 60 second annealing at 80° C. Uniaxial stretching was performed at a rate of 2%/min and the film was extended by 250% to 400% in 50% increments. The best results were obtained with uniaxial stretching to 350%.

Lamination

The film stack was laminated at 125° F. (51° C.), to a glass slide using a thermal film laminator (GBC Catena 35, GBC Document Finishing, Lincolnshire, Ill.). The laminated sample was removed from the laminator and allowed cool to room temperature.

Bake-out

After lamination, the sample was placed in a nitrogen purged furnace (Lindberg Blue M box furnace model 51642-HR, Asheville N.C., USA). The sample was brought from 25° C. to 310° C. at a rate of approximately 10° C./min and held for two hours. The furnace and sample were then allowed to cool down to ambient temperature. The result was a thin film of silver nanowires on the glass surface. SEM images indicate a distinct orientation of the nanowires in the stretch direction. A control sample prepared in the same way, but without the orientation step, did not exhibit orientation of the nanowires.

Figure 7A:
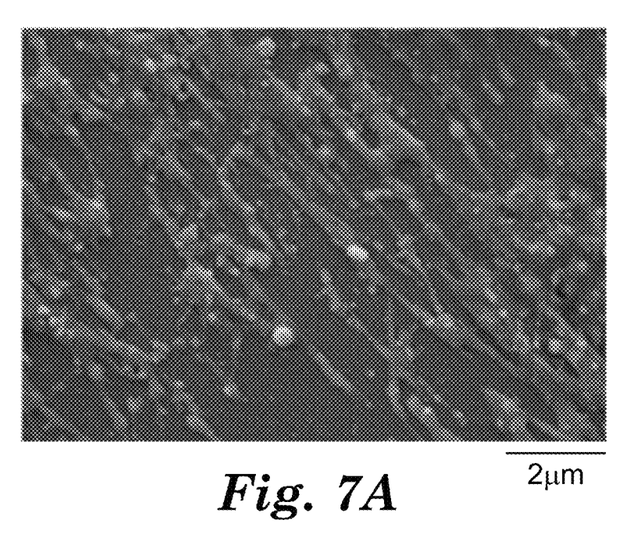
FIGS. 7A and 7B are images of the samples for Example 3.
Figure 7B:
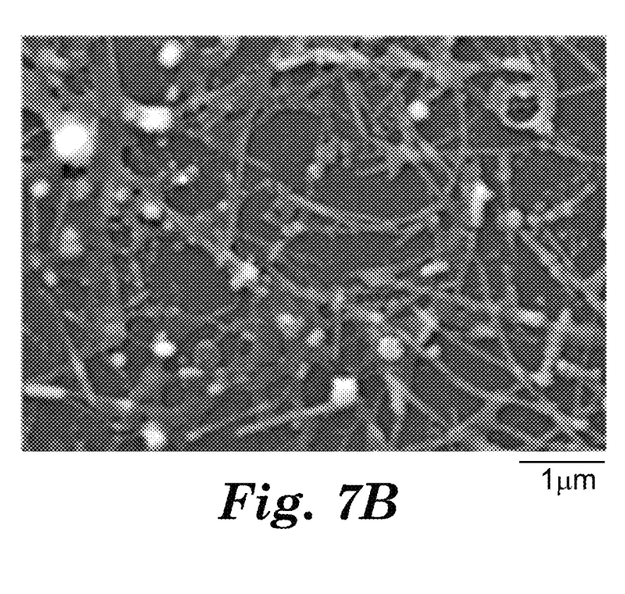

FIGS. 7A and 7B are images of the samples for Example 3. FIG. 7A is an image of a AgNW sample stretched, 350×, and FIG. 7B is an image of a AgNW control sample, unstretched.

The invention claimed is:

1. A method for templating nanoparticles on the surface of a thermally stable substrate, comprising the steps of:
   providing a thermally stable substrate with a structured template surface or layer;
   applying a coating of monodisperse nanoparticles in a sacrificial resin, the coating having a first surface substantially conforming to the structured template surface or layer and a second surface opposite the first surface; and
   baking-out the sacrificial resin to produce a templated layer of the nanoparticles on the structured template surface or layer.

2. The method of claim 1, wherein the providing step comprises providing as the thermally stable substrate a glass, quartz, or sapphire substrate.

3. The method of claim 1, wherein the providing step comprises providing as the thermally stable substrate a crystalline support wafer or semiconductor materials on a support wafer.

4. A method for transferring nanoparticles to thermally stable receptor substrate, comprising the steps of:
   providing a transfer film comprising a carrier substrate having monodisperse nanoparticles in a sacrificial resin;
   imparting a structure on the sacrificial resin on a side opposite the substrate to produce a structured surface on the sacrificial resin;
   applying a backfill layer to the transfer film, the backfill layer having a first surface substantially conforming to the structured surface and a second surface opposite the first surface;
   laminating the transfer film with the backfill layer to a thermally stable receptor substrate with the second surface of the backfill layer applied to the thermally stable receptor substrate, and removing the carrier substrate after the laminating; and
   baking-out the sacrificial resin to produce a templated layer of the nanoparticles on the first surface of the backfill layer.

5. The method of claim 4, wherein the laminating step comprises laminating the transfer film to a glass, quartz, or sapphire substrate.

6. The method of claim 4, wherein the laminating step comprises laminating the transfer film to a crystalline support wafer or to semiconductor materials on a support wafer.

7. The method of claim 4, wherein the baking-out step comprises baking-out the sacrificial resin at a sufficient rate to generate colloidal epitaxial growth of the nanoparticles and produce a templated multi-layer of nanoparticles on the first surface of the backfill layer.

8. A method for transferring dimensionally anisotropic nanomaterials to thermally stable receptor substrate, comprising the steps of:
   providing a transfer film comprising a first sacrificial substrate, a second sacrificial substrate, and a dimensionally anisotropic nanomaterials formulation between the first and second substrates;
   uniaxially stretching the transfer film under a heat treatment;
   laminating the transfer film to a thermally stable receptor substrate; and
   baking-out the first and second sacrificial substrates to produce aligned dimensionally anisotropic nanomaterials from the dimensionally anisotropic nanomaterials formulation on the thermally stable receptor substrate.

9. The method of claim 8, wherein the dimensionally anisotropic nanomaterials are nanowires or nanotubes.

10. The method of claim 8, wherein the laminating step comprises laminating the transfer film to a glass, quartz, or sapphire substrate.

11. The method of claim 8, wherein the laminating step comprises laminating the transfer film to a crystalline support wafer or to semiconductor materials on a support wafer.

12. A method for transferring dimensionally anisotropic nanomaterials to thermally stable receptor substrate, comprising the steps of:
   providing a transfer film comprising a sacrificial material and dimensionally anisotropic nanomaterials;
   uniaxially stretching the transfer film under a heat treatment;
   laminating the transfer film to a thermally stable receptor substrate; and
   baking-out the sacrificial material to produce aligned dimensionally anisotropic nanomaterials on the thermally stable receptor substrate.

13. The method of claim 12, wherein the dimensionally anisotropic nanomaterials are nanowires or nanotubes.

14. The method of claim 12, wherein the laminating step comprises laminating the transfer film to a glass, quartz, or sapphire substrate.

15. The method of claim 12, wherein the laminating step comprises laminating the transfer film to a crystalline support wafer or to semiconductor materials on a support wafer.

16. A method for transferring nanowires to thermally stable receptor substrate, comprising the steps of:
   providing a transfer film comprising a first sacrificial substrate, a second sacrificial substrate, and a dimensionally anisotropic nanomaterials formulation between the first and second substrates;
   uniaxially stretching the transfer film under a heat treatment;
   imparting a structure on the first substrate on a side opposite the dimensionally anisotropic nanomaterials formulation to produce a structured surface on the first substrate;
   applying a backfill layer to the transfer film, the backfill layer having a first surface substantially conforming to the structured surface of the first substrate and a second surface opposite the first surface;

laminating the transfer film with the backfill layer to a thermally stable receptor substrate with the second surface of the backfill layer applied to the thermally stable receptor substrate; and baking-out the first and second sacrificial substrates to produce aligned and templated dimensionally anisotropic nanomaterials from the dimensionally anisotropic nanomaterials formulation on first surface of the backfill layer on the thermally stable receptor substrate.

17. The method of claim 16, wherein the dimensionally anisotropic nanomaterials are nanowires or nanotubes.

18. The method of claim 16, wherein the laminating step comprises laminating the transfer film to a glass, quartz, or sapphire substrate.

19. The method of claim 16, wherein the laminating step comprises laminating the transfer film to a crystalline support wafer or to semiconductor materials on a support wafer.

20. A method for transferring nanowires to thermally stable receptor substrate, comprising the steps of:
providing a transfer film comprising a sacrificial material and dimensionally anisotropic nanomaterials;
uniaxially stretching the transfer film under a heat treatment;
imparting a structure on the transfer film to produce a transfer film with a structured surface and a second surface opposite the structured surface;
applying a backfill layer to the transfer film, the backfill layer having a first surface substantially conforming to the structured surface of the transfer film and a second surface opposite the first surface;
laminating the transfer film with the backfill layer to a thermally stable receptor substrate, the second surface of the backfill layer that is applied to the thermally stable receptor substrate; and
baking-out the sacrificial material to produce aligned and templated dimensionally anisotropic nanomaterials on first surface of the backfill layer on the thermally stable receptor substrate.

21. The method of claim 20, wherein the dimensionally anisotropic nanomaterials are nanowires or nanotubes.

22. The method of claim 20, wherein the laminating step comprises laminating the transfer film to a glass, quartz, or sapphire substrate.

23. The method of claim 20, wherein the laminating step comprises laminating the transfer film to a crystalline support wafer or to semiconductor materials on a support wafer.

* * * * *